United States Patent [19]

Brunner

[11] Patent Number: 4,475,811
[45] Date of Patent: Oct. 9, 1984

[54] OVERLAY TEST MEASUREMENT SYSTEMS

[75] Inventor: Timothy A. Brunner, Norwalk, Conn.

[73] Assignee: The Perkin-Elmer Corporation, Norwalk, Conn.

[21] Appl. No.: 489,664

[22] Filed: Apr. 28, 1983

[51] Int. Cl.³ .............................................. G03B 43/00
[52] U.S. Cl. ................................. 355/133; 324/158 R; 430/5
[58] Field of Search ................. 355/125, 132, 133, 45, 355/43, 79; 356/401, 400; 324/158 R; 430/22, 5

[56] References Cited

U.S. PATENT DOCUMENTS

| 3,743,417 | 7/1973 | Smatlak | 355/125 |
| 3,771,872 | 11/1973 | Nightingale et al. | 355/125 |
| 3,873,203 | 3/1975 | Stevenson | 355/133 |
| 3,914,050 | 10/1975 | Dost et al. | 355/133 |
| 4,286,871 | 9/1981 | Erickson | 355/133 |

OTHER PUBLICATIONS

SPIE, vol. 334, Optical Microlithography Tech. for Mid 1980s, (1982), "Variable Magnification in a 1:1 Projection Lithography System", pp. 2–9, James J. Greed, Jr., David A. Markle.
Technical Digest, 1977 International Electron Devices Meeting, Dec. 5–7, (1977), pp. 7–7F, "A Comparison of Electrical and Visual Alignment Test Structures for Evaluation Photomask Alignment in Integrated Circuit Manufacturing", T. J. Russell et al.
IEEE Transactions of Electron Devices, vol. ED-26, No. 4, Apr. 1979, "Automatic Testing and Analysis of Misregistrations Found in Semiconductor Processing", pp. 729–732, Ivor J. Stemp et al.
Solid State Technology/May 1981, "Microelectric Test Structures for Characterizing Fine–Line Lithography, pp. 126–140, D. S. Perloff et al.
Solid State Technology/Sep. 1980, "Use of Microelectronic Test Structures to Characterize IC Materials, Processes, and Processing Equipment", G. P. Carver et al.
Solid State Technology/Feb. 1980, "Real–Time Monitoring of Semiconductor Processes Uniformity", pp. 81–86, D. S. Perloff et al.
Solid State Science and Technology/Mar. 1981, "Alignment, and Mask Errors in IC Processing, pp. 609–614, K. H. Nicholas et al.
Fifteenth Symposium on Electron Ion and Photon Beam Technology, Boston, May 1979, "Performance Limits in 1:1 UV Projection Lithography", pp. 26–34, J. H. Bruning.

*Primary Examiner*—John Gonzales
*Assistant Examiner*—Della J. Rutledge
*Attorney, Agent, or Firm*—T. P. Murphy; E. T. Grimes

[57] ABSTRACT

This invention relates to overlay test measurement systems which are useful for testing lithographic instruments used in making microcircuits, which includes a single second-level pattern set in the middle of a checkerboard-like arrangement of first level patterns alternating with opaque patterns, the patterns being constructed and arranged so that if a second substantially identical cluster is imaged on the first cluster with the second level pattern of the second cluster aligned with any one of the first level patterns on the first cluster then the opaque patterns of the second cluster would be aligned with the other first level patterns on the first cluster thereby protecting them from exposure.

According to a feature of the invention there is provided a method of making a test wafer of the type described as well as a method of testing the alignment of lithographic tools using the aforesaid test mask and test wafer.

13 Claims, 2 Drawing Figures

OVERLAY TEST MEASUREMENT SYSTEMS

FIELD OF THE INVENTION

This invention relates to microcircuits in general and more particularly to overlay test measurement systems, which are useful for testing lithographic tools used in making microcircuits.

This application is closely related to patent application entitled, "Overlay Test Wafer" Ser. No. 489,641 filed on even date herewith. The disclosure therein is incorporated herein by reference.

BACKGROUND OF THE INVENTION

In a typical microcircuit there are seven layers of patterning. The size of a microcircuit is determined by the minimum possible line width and line spacings which can be obtained. These in turn are, in part, determined by the accuracy with which one pattern can be placed on top of another. The smaller the error in overlay placement the greater the packing density which can be achieved. Typically, machines now being made for projection lithography have specifications of the order of ½ micron. This error is made up of two factors. One is an alignment error and the other is a distortion error. Alignment error is determined by the ability of the operator or automatic alignment system of the machine to position one pattern level over another. Distortion is the error inherent in the imaging system of the machine. It is desired to be able to measure both types of error and to maintain accuracy within the prescribed limit with respect to both.

It is necessary that overlay accuracy measurements be made during production and initial calibration of machines and also periodically in service to assure that accuracy is being maintained. One way that this has been done in the past was to print vernier patterns on a substrate and optically to read these patterns. For example, a pattern consisting of a set of lines with a pitch of 10 microns would be placed next to another pattern with a pitch of 9.57 microns. If overlay were perfect, the two sets of lines would line up at their center and, going out from the center, each line of the second pattern would be progressively closer to the center than the corresponding line of the first pattern. If overlay were in error by 0.25 $\mu$m, then the two sets of lines would line up at a position displaced by one line from the pattern center.

Furthermore, in carrying out the measurements of this nature it should be noted that measurements are taken at a plurality of sites on a wafer and that checks are made in both the X and Y direction.

The main problem with optical measurements, other than the fact that they depend on human operators, is that they are limited in accuracy. In the above example, it is only possible to read to a quarter of a micron and to interpolate to an eight of a micron. Thus, there have been proposals to utilize electrical techniques. The advantage of electrical techniques is that they permit automated and more accurate measurements utilizing probes at appropriate stations. Examples of literature describing prior art electrical measurement techniques are the following:

*Solid State Technology* "Microelectronic Test Structures for Characterizing Fine-Line Lithography," D. S. Perloff, T. F. Hasan, D. H. Hwang and J. Frey, May, 1981, pp. 126–129 and 140.

*Solid State Technology*, "Use of Microelectronic Test Structures to Characterize IC Materials, Processes, and Processing Equipment," G. P. Carver, L. W. Linholm and T. J. Russell, September, 1980, pp. 85–92.

*Solid State Technology*, "Real-Time Monitoring of Semiconductor Process Uniformity," D. S. Perloff, T. F. Hasan and E. R. Blome, February, 1980, pp. 81–86.

*Solid-State Science and Technology*, "Alignment, and Mask Errors in IC Processing," K. H. Nicholas, I. J. Stemp and H. E. Brockman, March, 1981, pp. 609–614.

*Fifteenth Symposium on Electron, Ion and Phonton Beam Technology*, "Performance Limits in 1:1 UV Projection Lithography," J. H. Bruning, May, 1979, pp. 1–8.

However, in the resistance measurements which are known in the prior art, first and second levels of a conductor are constructed such as to obtain a pair of resistors which, if the overlay is perfect will have equal values. The difference in resistance value is a measure of the offset error. However, using these prior art techniques, the first or base level was destroyed, by the overlay of the second layer, each time a test was carried out. This required having a large plurality of base patterns constructed for testing. However it is difficult reproducibly and accurately to make base patterns. The base pattern must be as distortion-free as possible. This is normally accomplished by contact printing. However, there is a limit to the number of circuits which can be contact printed with a master mask. Thus, the ideal would be a base pattern which could be used over and over again for calibration, maintenance and so forth. With such a base pattern, since the same base pattern would be used from time to time, any changes would be caused by changes in the apparatus being tested and could not be attributed to a new base pattern. Over a period of time, in addition to saving time and money, the availability of a reusable base pattern would insure better accuracy and repeatability.

SUMMARY OF INVENTION

Briefly, the present invention provides a new and improved master test mask for testing the overlay alignment of a second level pattern over a first level pattern for testing lithographic equipment used in making microcircuits, which is characterized by a mask having a cluster in the form of a plurality of first level patterns alternating with a plurality of opaque patterns and a single second level pattern, the first level patterns and the opaque patterns being of substantial equal area, respectively. Further, according to the invention, the patterns are constructed and arranged so that if said patterns are imaged onto a second substantially identical cluster with the second level pattern of the first cluster aligned with any one of the first level patterns on the second cluster then the opaque patterns of the first cluster would be aligned with the other first level patterns on the second cluster, thus protecting these other first level patterns from exposure.

According to one aspect of the invention there are a plurality of clusters similar to the first cluster disposed in spaced relationship one with respect to the others. According to another aspect of the invention the patterns are exposed in a checkerboard-like configuration.

According to another form of the invention there is provided a test mask usable for making a test wafer for testing the overlay alignment of a second level pattern over a first level pattern for testing lithographic equipment used in making microcircuits, which can be fabricated by imaging the first level patterns, opaque patterns and second level pattern of the aforementioned master test mask onto a test wafer.

According to still another aspect of the invention there is provided a new and improved method of testing the alignment of lithographic instruments or tools which comprises the steps of inserting a master test mask into lithographic instruments, said test mask having a cluster of patterns in the form of a plurality of first level patterns alternating with a plurality of opaque patterns and a single second level pattern, said first level patterns and said opaque patterns being of substantially equal areas, respectively. The method further includes the steps of inserting a photoresist coated test wafer into the lithographic instrument, said test wafer having thereon an image of the cluster of patterns on the test mask, aligning the test mask so that the second level pattern of the test mask is aligned with a preselected one of said first level patterns on the test wafer, said patterns being constructed and arranged so that the opaque patterns of the test mask are aligned with the other first level patterns on said test wafer, respectively. The method further includes the steps of exposing and developing the test wafer and then electrically testing the exposed test wafer to thereby measure the accuracy of the alignment.

There has thus been outlined rather broadly the more important features of the invention in order that the detailed description thereof that follows may be better understood, and in order that the present contribution to the art may be better appreciated. There are, of course, additional features of the invention which will be described hereinafter and which will form the subject of the claims appended hereto. Those skilled in the art will appreciate that the conception on which this disclosure is based may readily be utilized as a basis for the designing of other systems for carrying out the several purposes of the invention. It is important, therefore, that the claims be regarded as including such equivalent systems as do not depart from the spirit and scope of the invention.

Several embodiments of the invention have been chosen for purposes of illustration and description, and are shown in the accompanying drawings, forming a part of the specification.

DETAILED DESCRIPTION OF THE PREFERRED EMBODIMENTS

Figure 1:
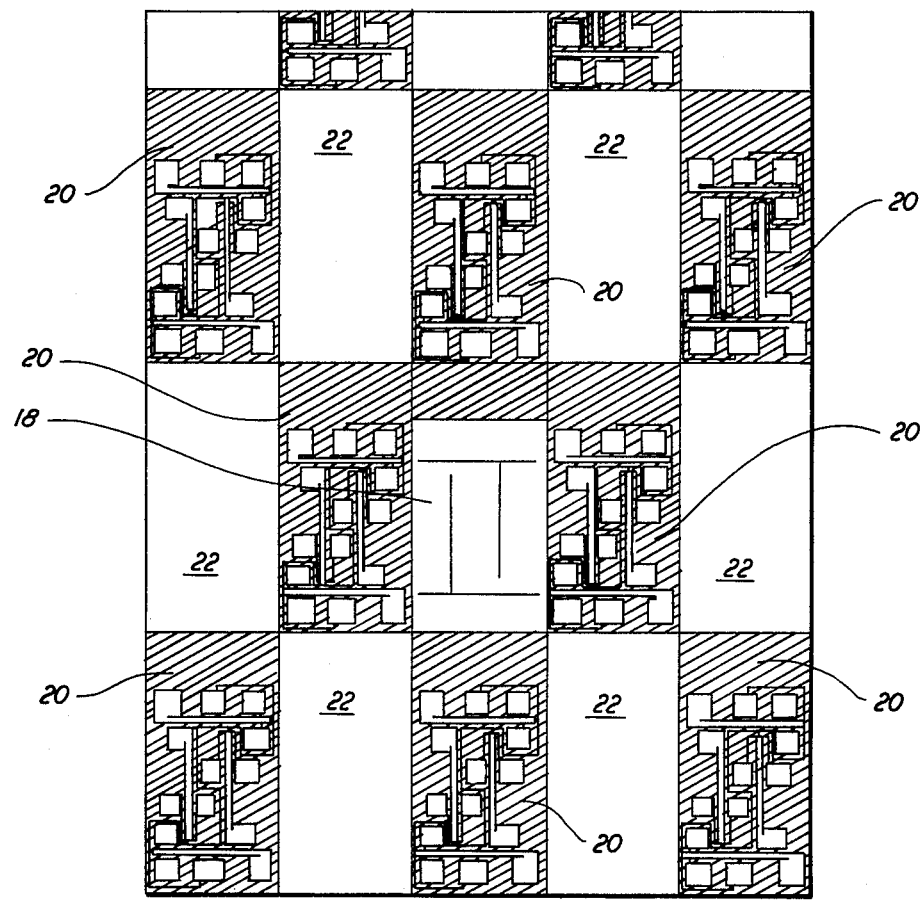
FIG. 1 is an enlarged plan view of a portion of a test mask or test wafer showing a cluster arrangement of test patterns.

Referring to FIG. 1, there is illustrated a portion of a test mask or test wafer showing a cluster arrangement of test patterns. Each cluster contains a single second level pattern 18 surrounded by a checkerboard-like configuration of first level patterns 20 alternating with opaque or blank chrome rectangles 22. The pattern is fabricated on a test mask in any suitable conventional manner. Preferably, it is fabricated from chrome on fused silica. This pattern is imaged onto a test wafer as by means of contactprinting or projection printing, for example. It may be imaged on a one-to-one basis or it may be magnified, as desired, depending on the type of lithographic machine to be tested. As an example, the test wafer may be silicon with 8000 Å of $S_iO_2$ thermally grown followed by a layer of chrome deposited thereover. On top of the chrome is a layer of photoresist. The wafer is exposed and developed, etched and stripped to provide an electrically probe-able overlay pattern.

Figure 2:
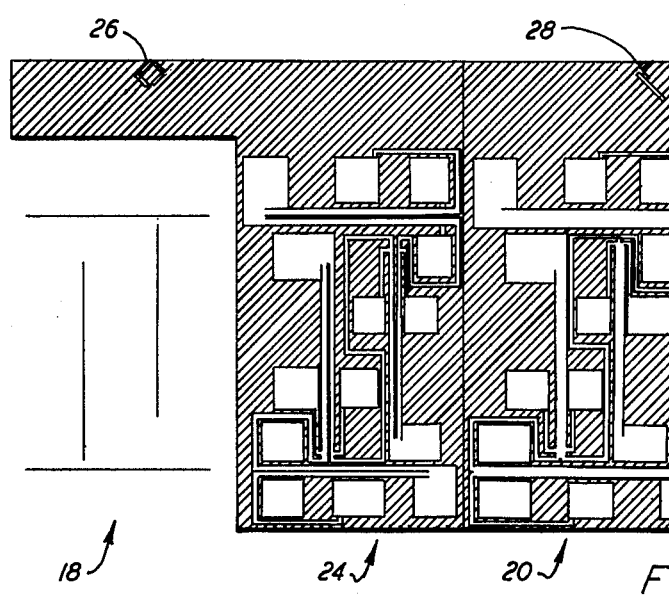
FIG. 2 is a greatly enlarged plan view showing a first level pattern, a second level pattern and an overlay or probe-able pattern.

The first exposure creates a cluster of a plurality of first level patterns. Tests have been made with as many as 25 first level patterns on a five millimeter by five millimeter die. The wafer is then ready for insertion in a lithographic instrument to be tested such as a projection aligner, for example, and aligned so that the second level pattern on the test mask is superimposed on the desired first level pattern on the test wafer. As best seen in FIG. 2, there is illustrated a first level pattern 20, a second level pattern 18 and an overlay or probe-able pattern 24. That is, by using targets 26 and 28 the second level pattern of the test mask is superimposed or overlayed on any desired one of the first level patterns on the test wafer and a second exposure is made. This is developed, etched and stripped if necessary to produce the overlay or probe-able pattern 24 in FIG. 2. In FIG. 2, the dark areas are oxide and the light areas are chrome. The electrical probe technique may be employed to determine the overlay error by making use of its linewidth measuring capability, as described more fully in the aforementioned patent application entitled "Overlay Test Wafer".

It will be particularly appreciated that due to the checkerboard-like cluster arrangement of the test patterns, the second level pattern 18 on the test mask can be aligned to any desired first level pattern 20 on the test wafer while all of the other first level patterns on the test wafer are protected from exposure by the opaque blank areas 22 on the mask. This makes it possible to use the same test wafer for a plurality of tests, such as twenty-five for example. As a result, there is the ability to pack a great deal of test information on a single wafer. For example, twenty-five different aligners can be tested against the same reference pattern on a single test wafer and, if need be, imaged in the same resist coating. This facilitates comparisons between different aligners independent of wafer-to-wafer variations. Also, if desired, twenty-five alignments could be performed on a single instrument to monitor the repeatability and stability of its overlay performance over any desired interval of time.

It is noted that on each test wafer there are a plurality of clusters or a global array. For example, about two hundred clusters can be used, if desired. At each measured point the position of the wafer in the X and Y directions is recorded along with the overlay errors in both directions. The distribution of errors over a single wafer can be displayed graphically in the form of a vector map. Exhaustive studies of overlay performance are made possible.

It will be appreciated that the concepts of the present invention are applicable to many different types of lithographic instruments such as, for example, projection printers, steppers, x-ray aligners, and ebeam writing systems.

Although specific embodiments have been illustrated and described, it will be obvious to those skilled in the art that various modifications may be made without departing from the spirit and scope of the invention, which is to be limited solely by the appended claims.

What is claimed is:

1. A test wafer for testing the overlay for alignment of a second level pattern over a first level pattern for testing lithographic instruments used in making microcircuits comprising:

a wafer having a cluster in the form of a plurality of first level patterns alternating with a plurality of opaque patterns and a single second level pattern, said first level patterns and said opaque patterns being of substantially equal areas respectively, said patterns being constructed and arranged so that if a second substantially identical cluster is imaged on said first cluster with said second level pattern of the second cluster aligned with any one of said first level patterns on said first cluster then the opaque patterns of the second cluster would be aligned with the other first level patterns on said first cluster.

2. A test wafer according to claim 1 wherein said test wafer has a plurality of clusters similar to the first cluster disposed in spaced relationship one with respect to the others.

3. A test wafer according to claim 1 wherein said patterns are disposed in a checkerboard-like configuration.

4. A master test mask usable for making a test wafer for testing the overlay alignment of a second level pattern over a first level pattern for testing lithographic equipment used in making microcircuits comprising:

a mask having a cluster in the form of a plurality of first level patterns alternating with a plurality of opaque patterns and a single second level pattern, said first level patterns and said opaque patterns being of substantially equal areas respectively, said patterns being constructed and arranged so that if said patterns are imaged onto a second substantially identical cluster with said second level pattern of the first cluster aligned with any one of said first level patterns on said second cluster then the opaque patterns of said first cluster would be aligned with the other first level patterns on said second cluster respectively.

5. A master test mask according to claim 4 wherein said test mask has a plurality of clusters similar to the first cluster disposed in spaced relationship one with respect to the others.

6. A master test mask according to claim 4 wherein said patterns are disposed in a checkerboard-like configuration.

7. A method of making a test wafer for testing the overlay alignment of a second level pattern over a first level pattern for testing lithographic equipment used in making microcircuits comprising the steps of:

imaging a master test mask onto a photoresist coated test wafer, said test mask having a cluster in the form of a plurality of first level patterns alternating with a plurality of opaque patterns and a single second level pattern, said first level patterns and said opaque patterns being of substantially equal areas respectively;

exposing said test wafer to form an image of said test mask patterns on said test wafer, said patterns being constructed and arranged so that if the patterns on said master test mask are imaged on said test wafer with said second level pattern of said test mask being aligned with any one of said first level patterns on said test wafer than the opaque patterns of the test mask would be aligned with the other first level patterns on said test wafer respectively.

8. A method of making a test wafer for testing the overlay alignment of a second level pattern over a first level pattern for testing lithographic equipment used in making microcircuits comprising the steps of:

inserting a master test mask into a projection mask aligner, said test mask having a cluster in the form of a plurality of first level patterns alternating with a plurality of opaque patterns and a single second level pattern, said first level patterns and said opaque patterns being of substantially equal areas respectively;

inserting a photoresist coated test wafer into said projection mask aligner, exposing said test wafer to form an image of said patterns on said test wafer; said patterns being constructed and arranged so that if the patterns on said master test mask are imaged on said test wafer with said second level pattern of said test mask being aligned with any one of said first level patterns on said test wafer then the opaque patterns of the test mask would be aligned with the other first level patterns on said test wafer respectively.

9. A method of making a test wafer according to claim 8 wherein said mask has a plurality of clusters similar to the first cluster disposed in spaced relationship one with respect to the others.

10. A method of making a test wafer according to claim 8 wherein said patterns are disposed in a checkerboard-like configuration.

11. A method of testing the alignment of lithographic instruments comprising the steps of:

inserting a master test mask into a lithographic instrument, said test mask having a cluster of patterns in the form of a plurality of first level patterns alternating with a plurality of opaque patterns and a single second level pattern, said first level patterns and said opaque patterns being of substantially equal areas respectively;

inserting a photoresist coated test wafer into said lithographic instrument, said test wafer having an image of the cluster of patterns on the test mask;

aligning said test mask so that the second level pattern of the test mask is aligned with a preselected one of said first level patterns on said test wafer, said patterns being constructed and arranged so that the opaque patterns of the test mask are aligned with the other first level patterns on said test wafer respectively;

exposing and developing said test wafer and electrically testing said exposed test wafer to thereby test the accuracy of alignment.

12. A method of testing according to claim 11 wherein said mask has a plurality of clusters similar to the first cluster disposed in spaced relationship one with respect to the others.

13. A method according to claim 11 wherein said patterns are disposed in a checkerboard-like configuration.

* * * * *